United States Patent
Petrmichl et al.

[11] Patent Number: 5,888,593
[45] Date of Patent: Mar. 30, 1999

[54] ION BEAM PROCESS FOR DEPOSITION OF HIGHLY WEAR-RESISTANT OPTICAL COATINGS

[75] Inventors: Rudolph Hugo Petrmichl, Center Valley; Leonard Joseph Mahoney; Ray Hays Venable III, both of Allentown; Norman Donald Galvin, Easton; Bradley J. Knapp, Kutztown; Fred Michael Kimock, Macungie, all of Pa.

[73] Assignee: Monsanto Company, St. Louis, Mo.

[21] Appl. No.: 631,170

[22] Filed: Apr. 12, 1996

Related U.S. Application Data

[63] Continuation of Ser. No. 603,652, Feb. 20, 1996, abandoned, which is a continuation-in-part of Ser. No. 205,898, Mar. 3, 1994, Pat. No. 5,508,368.

[51] Int. Cl.[6] .............................. H05H 1/20; H05H 1/02; H05H 1/24; C23C 14/00
[52] U.S. Cl. ....................... 427/563; 427/534; 427/573; 427/574; 427/577; 427/579; 204/192.37; 204/192.35
[58] Field of Search ................................... 427/524, 525, 427/527, 529, 530, 562, 563, 574, 579, 577, 534, 573; 204/37, 192.35

[56] References Cited

U.S. PATENT DOCUMENTS

| | | |
|---|---|---|
| 4,282,267 | 8/1981 | Kuyel . |
| 4,474,827 | 10/1984 | Ferrralli . |
| 4,647,494 | 3/1987 | Meyerson et al. . |
| 4,776,925 | 10/1988 | Fossum et al. . |
| 4,795,656 | 1/1989 | Mizoguchi et al. . |
| 4,800,100 | 1/1989 | Herbots et al. . |
| 4,862,032 | 8/1989 | Kaufman et al. ..................... 313/359.1 |
| 4,992,298 | 2/1991 | Deutchman et al. . |
| 5,013,690 | 5/1991 | Hochberg et al. . |
| 5,051,308 | 9/1991 | Reed et al. ............................... 427/489 |
| 5,093,152 | 3/1992 | Bonet et al. . |
| 5,156,882 | 10/1992 | Rzad et al. . |
| 5,190,807 | 3/1993 | Kimoch et al. ......................... 428/216 |
| 5,206,060 | 4/1993 | Balian et al. . |
| 5,266,398 | 11/1993 | Hioki et al. . |

OTHER PUBLICATIONS

Kaufman et al., "End–Hall Ion Source", *J. Vac. Sci. Technol., A.* vol. 5, No. 4. pp. 2081–2084, Jul./Aug. 1987.

G. Dearnaly, Clinical Materials, vol. 12, pp. 237–244 (1993) *Diamond–like Carbon: A Potential Means of Reducing Wear in Total Joint Replacements,* No Month.

*Primary Examiner*—Marianne Padgett
*Attorney, Agent, or Firm*—Coudert Brothers

[57] ABSTRACT

An ion beam deposition method is provided for manufacturing a coated substrate with improved wear-resistance, and improved lifetime. The substrate is first chemically cleaned to remove contaminants. Secondly, the substrate is inserted into a vacuum chamber onto a substrate holder, and the air therein is evacuated via pump. Then the substrate surface is bombarded with energetic ions from an ion beam source supplied from inert or reactive gas inlets to assist in removing residual hydrocarbons and surface oxides, and activating the surface. After sputter-etching the surface, a protective, wear-resistant coating is deposited by plasma ion beam deposition where a portion of the precursor gases are introduced into the ion beam downstream of the ion source, and hydrogen is introduced directly into the ion source plasma chamber. The plasma ion beam-deposited coating may contain one or more layers. Once the chosen coating thickness is achieved, deposition is terminated, vacuum chamber pressure is increased to atmospheric and the coated substrate products having wear-resistance greater than glass are removed from the chamber. These coated products may be ceramics, architectural glass, analytical instrument windows, automotive windshields, and laser bar code scanners for use in retail stores and supermarkets.

15 Claims, 1 Drawing Sheet

FIG._1

ION BEAM PROCESS FOR DEPOSITION OF HIGHLY WEAR-RESISTANT OPTICAL COATINGS

This is a continuation of application Ser. No. 08/603,652, filed Feb. 20, 1996, now abandoned, which is a continuation-in-part of application U.S. Ser. No. 08/205,898, filed Mar. 3, 1994, now U.S. Pat. No. 5,508,368.

FIELD OF THE INVENTION

This invention relates generally to a process for depositing coatings which protect a substrate from wear and abrasion. More particularly, the invention relates to a process for protecting such substrates as plastic sunglass lenses, ophthalmic lenses, bar code scanner windows, and industrial wear parts from scratches and abrasion.

BACKGROUND OF THE INVENTION

There are numerous prior art methods for coating substrates to improve their performance, e.g. lifetime, abrasion wear resistance and similar properties. For example, consider the case of plastic sunglass lenses or plastic prescription eyewear. Due to the ease of scratching plastic, abrasion-resistant coatings are deposited onto the surface of plastic lenses. These hard outer coatings increase the useful life of the lenses. To make such coatings marketable, the process for depositing these hard coatings must be inexpensive, reliable and reproducible.

Plastic lenses sold into the ophthalmic lens market are largely coated by acrylic and polysiloxane dip-coatings or spin coatings. These coatings significantly improve the abrasion resistance of the lens compared to the uncoated lens. This is particularly true for the case of polycarbonate which is very subject to abrasion. However, improved abrasion resistance of coated lenses is still a major problem in the ophthalmic lens industry. The industrial goal is to obtain plastic lenses which exhibit the same abrasion resistance as glass lenses. Current commercial plastic lenses have abrasion resistance characteristics which are poor compared to optical glass. Therefore, when purchasing lenses, one must choose between glass, which is very abrasion resistant but is heavier, or plastic which is lighter but much less abrasion-resistant.

While glass is roughly 30 times harder than plastic, there are many applications for glass where the lifetime of the product is restricted by the limited abrasion resistance of this material. Such products include architectural glass, analytical instrument windows, automotive windshields, and laser bar code scanners for use in retail stores and supermarkets. For example, the read failure rates of uncoated bar code scanner windows in typical grocery store checkout lanes increase noticeably within a matter of weeks due to damage by impacting cans and bottles.

Various coatings made by techniques other than the wet chemical methods have been suggested for plastic substrates, including lenses for optical products. Most of these coatings are so-called "plasma polymers" which are largely produced by creating a plasma from siloxane precursor gases. The substrates are exposed to the plasma, but they are not biased to cause energetic ion bombardment. The performance of these plasma polymers is often only marginally better than that of the polysiloxane and acrylic spin and dip coatings, and the performance of these coatings does not approach the performance of glass. These films are often quite soft and are not useable as protective coatings except on extremely soft substrates.

Other coating processes have been suggested in which energetic ion bombardment is caused by mounting the substrates on the powered electrode in a radio frequency (RF) plasma system and exposing the parts to the plasma, thereby creating a negative bias on the substrate surface. The resultant coatings are often more abrasion resistant than the "plasma polymers". These plasma systems are not readily scaled to a throughput required for mass production nor are they easily operated in a reproducible, controlled fashion in a production environment. The RF plasma process also suffers in that the deposition process, and the properties of the resultant coating are dependent on whether the substrate to be coated is an electrical conductor or insulator. Furthermore, if the substrate is an insulator, the thickness of the substrate strongly influences the deposition process energetics and the properties of the resultant coating. This means that for production coating of insulating substrates of different size and shape, e.g. plastic lenses, it may be necessary to have different coating processes for each type of substrate. This reduces the flexibility of the process for use in production. Additionally, systems with large area electrodes are not widely available. For example, there are no readily available commercial parallel plate RF deposition systems having large electrodes, i.e. at least one meter in diameter.

The following references illustrate prior art coating processes in which plasmas are used in direct contact with the surface of the substrate:

Rzad et. al., U.S. Pat. No. 5,156,882, describe a method of preparing a transparent plastic article having an improved protective stratum thereon. The protective stratum is deposited by plasma enhanced chemical vapor deposition (PECVD).

Balian et. al., U.S. Pat. No. 5,206,060, describe a process and device for depositing thin layers on a substrate using a plasma chemical vapor deposition (PCVD) technique. The substrate must be made conductive, and is used as an electrode in the PCVD process.

Reed et. al., U.S. Pat. No. 5,051,308, describe an abrasion-resistant article and a method for producing the same. The article includes a plastic substrate and a gradational coating applied by a PECVD process.

Devins et. al., U.S. Pat. No. 4,842,941, also describe an abrasion-resistant article and a method for making the same. The article includes a polycarbonate substrate, an interfacial layer of an adherent resinous composition on the substrate, and an abrasion-resistant layer applied on top of the interfacial layer by PECVD.

Brochot et. al., U.S. Pat. No. 5,093,153 describe a coated object comprising a glass substrate coated with an organomineral film by a PECVD process.

Kubacki, U.S. Pat. No. 4,096,315, describes a low-temperature plasma polymerization process for coating an optical plastic substrate with a single layer coating for the purpose of improving the durability of the plastic.

Enke et. al., U.S. Pat. No. 4,762,730, describe a PECVD process for producing a transparent protective coating on a plastic optical substrate surface.

All of the prior art plasma deposition methods for application of wear and abrasion-resistant coatings suffer from one or more of the following deficiencies and shortcomings:

(1) difficulty in pre-cleaning of substrates prior to deposition;

(2) adhesion of the protective, abrasion-resistant coating;

(3) permeation of the coatings by water vapor and oxygen;

(4) fabrication of coherent, dense coatings;

(5) control of coating properties during a deposition run and batch-to-batch variation of coating characteristics;

(6) coating thickness control and reproducibility of thickness;

(7) part-to-part and batch-to-batch control of coating uniformity;

(8) difficulty in coating substrates of complex geometry or configuration; and (9) production readiness and ability to scale-up the deposition process for mass production.

These shortcomings are highlighted in the following review of the two preferred prior art methods for deposition of abrasion-resistant coatings on plastic optical substrates: plasma polymerization and biased RF plasma deposition.

The first problem encountered by both methods is the difficulty in pre-cleaning the substrates prior to deposition of the adhesion layer or abrasion-resistant film. Typically substrates are pre-cleaned in an inert gas or glow discharge (plasma) prior to deposition. This pre-cleaning technique suffers from low cleaning rate, and re-contamination of the substrate by sputtered contaminants which are deposited back onto the substrate.

One of the key requirements for a protective coating on a variety of substrates, including optics, is the need to provide a barrier to moisture, oxygen, and other environmental elements. This requires formation of a coating structure with optimal atom packing density. This atom packing density is maximized by a high degree of ion bombardment during film growth, which is not easily attainable or optimized by the plasma polymerization methods of the prior art.

Regarding the control of the coating properties within a single deposition run, and from batch-to-batch, it is well known that control is difficult with the plasma deposition methods. For the case of deposition of electrically insulating coatings on electrically conductive substrates by the biased RF plasma technique, it is known that as the deposited coating thickness increases, there will be a gradual decrease of the surface bias on the growing film; see Meyerson et al., U.S. Pat. No. 4,647,494, column 6, line 67 through column 7, line 3. This decrease results in a change in the properties of the deposited coating, i.e. hardness, stress and hydrogen concentration.

Because the size and shape of the particular part to be coated, and its method of fixturing influence the plasma uniformity and plasma density around the part, it is difficult to predict and control deposition thickness uniformity across multiple parts coated within a single coating run using the plasma deposition methods of the prior art.

While the plasma deposition methods offer high deposition rates, it is difficult to reproducibly control deposition rate, deposition thickness and deposition uniformity across large areas with plasma deposition methods. Because of the interdependence of process variables such as pressure, gas flow rate, power, and substrate bias, accurate control of deposition thickness is difficult. Thus, it is very difficult to manufacture coating layers with thickness less than 0.1 micron, and with run-to-run thickness variation of less than approximately 10%. This is a significant disadvantage of the plasma deposition techniques of the prior art for the deposition of optical coatings, especially those requiring the use of multiple, thin layers of varying refractive index, such as antireflection coatings.

Finally, because of the sensitivity of the plasma deposition processes to substrate geometry, it is often impossible to coat parts of complex geometry or configuration. Examples of complex geometry include optical lenses with high corrective power which may be edged to a variety of shapes, industrial molds used to fabricate plastic parts, and other industrial machine parts, including shafts, gears, bearings, and the like. The current industrial trend is to fabricate many of these industrial machine parts from electrically insulating plastics and ceramics. These electrically insulating industrial machine parts are especially difficult to coat uniformly by the plasma deposition methods.

All of the difficulties above combine to make mass production of protective, abrasion-resistant coatings on a variety of substrates by the plasma deposition processes of the prior art very problematic indeed. Clearly, an improved method for flexible, reproducible, and high quality mass production of abrasion-resistant coatings has long been sought.

Ion beam etching and deposition of many materials is known in the prior art. For example, ion milling is commonly used in semiconductor processing. Ion beam systems typically are more controllable than RF plasma systems in that the deposition and etching process parameters, e.g. plasma potential, substrate bias, plasma current, gas flows and chamber pressures are not as strongly coupled as they are in the RF plasma process. This results in a wider process window and better control for ion beam processing, as compared to plasma processing. Additionally, ion beam deposition equipment is available which is capable of processing in excess of 1000 square inches of substrate material per batch. It is believed that RF equipment is not commercially available which approaches this level of scale. The combination of the higher degree of control for ion beam processing and the ability to scale to large areas allows for a process which is more easily moved into production and is more robust. However, one major disadvantage to prior art ion beam deposition processes, e.g. for deposition of DLC films, is their relatively low deposition rate which leads to long production times for thick coatings, and hence high production cost.

In an article published in Clinical Materials, Vol. 12, pages 237–244 (1993), G. Dearnaley describes a process in which low vapor pressure materials are condensed on the surface of the article to be coated and simultaneously bombarded by a high energy nitrogen ion beam. In this case, the ion energy required is greater than 10 kV. These large voltages are difficult to control and become problematic in a production environment. In addition, the coatings manufactured by this method are opaque and not useable for applications where a transparent coated product is required.

Kimock, et al., U.S. Pat. Nos. 5,135,808, 5,190,807, 5,268,217 disclose direct ion beam deposition processes using a hydrocarbon gas or carbon vapor for producing abrasion wear resistant products comprising substrates with hard outer coatings of substantially optically transparent diamond-like carbon (DLC) useful for commercial articles such as optical lenses, sunglass lenses, and bar code scanner windows.

SUMMARY OF THE INVENTION

The invention provides an improved method for deposition of an abrasion-resistant coating onto substrates. More particularly, this invention provides an ion beam deposited coating to the surface of a substrate which is highly adherent, and exhibits greatly improved wear resistance and environmental durability. Still more particularly, this invention provides a low cost and efficient process for mass-producing coated substrates with improved wear resistance and superior lifetime. The method is especially useful for applying an abrasion-resistant coating to the surface of optical plastic and glass substrates, such as plastic ophthalmic lenses and glass laser bar code scanner windows.

In the method of the present invention, the substrate is first chemically cleaned to remove unwanted materials and other contaminants. In the second step, the substrate is inserted into a vacuum chamber, the air in said chamber is evacuated and the substrate surface is sputter-etched by a beam of energetic ions to assist in the removal of residual contaminants such as residual hydrocarbons and surface oxides, and to activate the surface. After the substrate surface has been sputter-etched, a protective, abrasion-resistant coating is deposited using selected precursor gases by plasma ion beam deposition. A plasma is generated in a plasma chamber and a gas stream containing at least a portion of the precursor gases is introduced outside of a plasma ion source and into the plasma ion beam. Hydrogen gas is introduced directly into the plasma chamber during the deposition process. The ion beam-deposited coating may contain one or more layers. Once the chosen thickness of the coating has been achieved, the deposition process on the substrates is terminated, the vacuum chamber pressure is increased to atmospheric pressure, and the coated substrates having improved abrasion-resistance are removed from the vacuum chamber.

The present invention provides amorphous, conformal, protective, abrasion-resistant coatings containing a combination of the elements selected from the group consisting of C, Si, H, O and N. More particularly, the coatings of the present invention are selected from at least one of the following combinations of elements: Si and C; Si, C and H; Si and N; Si, N and H; Si and O; Si, O and H; Si, O and N; Si, O, N and H; Si, C and N; Si, C, H and N; Si, C and O; Si, C, H and O; Si, C, O and N; and Si, C, H, O and N.

The process for deposition of these coatings uses an ion beam source which operates with precursor gases comprising at least one of the following combinations of elements selected from the group consisting of Si and C; Si, C and H; Si and N; Si, N and H; Si and O; Si, O and H; Si, O and N; Si, O, N and H; Si, C and N; Si, C, H and N; Si, C and O; Si, C, H and O; Si, C, O and N; and Si, C, H, O and N. The process of the present invention is particularly well-suited to the manufacture of optically transparent coatings with tailored hardness, stress, and chemistry.

The optimum properties of coatings designed to protect optical plastic articles from wear and abrasion are distinct from the optimum characteristics of coatings designed to protecting glass products, thus there are two preferred embodiments of the present invention. The first preferred embodiment generates a highly optically transparent coating ideally suited for protecting soft and temperature sensitive optical materials such as plastic. The coating material of the first embodiment consists of C, H, Si, O and optionally N, is flexible with a tensile strain to microcracking of greater than about 1%, and is substantially harder than plastic with a Nanoindentation hardness in the range of about 2 to 5 Giga Pascals. While softer than glass, which has a hardness of about 6 Giga Pascals, this coating surprisingly provides abrasion resistance on plastic lenses greater than or about equal to the abrasion resistance of glass lenses, when deposited to sufficient thickness.

The second preferred embodiment generates an optically transparent coating ideally suited for protecting moderately hard and temperature insensitive optical materials, such as glass. The coating may be composed of multiple layers, including a thin adhesion layer, a thick and hard interlayer, and a thin diamond-like carbon top layer. The interlayer material consists of Si, N, O, and H, or Si, C, N, O, and H, and is much harder than glass with a Vickers microhardness in the range of about 1200 to 1700 kg/mm$^2$ (100 kg/mm$^2$ is about 1 Giga Pascal). When deposited to a thickness in the preferred range of about 3 to about 6 micrometers the composite coating is optically transparent in the visible region with a transmission greater than or equal to 75% at a wavelength of 633 nm.

Diamond-like carbon coatings with tailored thickness, mechanical properties, and optical properties can be made readily by the process of the present invention. The term "diamond-like carbon" (DLC) is meant to include amorphous materials composed of carbon and hydrogen, whose properties resemble, but do not duplicate, those of diamond. Some of these properties are high hardness ($H_v$=about 1,000 to about 5,000 kg/mm$^2$), low friction coefficient (approximately 0.1), transparency across the majority of the electromagnetic spectrum, and chemical inertness. At least some of the carbon atoms in DLC are bonded in chemical structures similar to that of diamond, but without long range crystal order. These DLC materials can contain up to 50 atomic percent of hydrogen. The DLC coatings made by the present invention are hard, inert and slippery, and are ideal for use in optical as well as many non-optical applications.

BRIEF DESCRIPTION OF THE DRAWING

Further features and advantages will become apparent from the following and more particular description of the preferred embodiment of the invention, as illustrated in the accompanying drawing in which.

DETAILED DESCRIPTION OF THE INVENTION

The method of the present invention substantially reduces or eliminates the disadvantages and shortcomings associated with the prior art techniques by providing:

(1) for the deposition of very highly abrasion-resistant coatings on a variety of substrates, including metals; ceramics, e.g., sapphire; glass-ceramics, e.g. Pyroceram® and Neoceram® products; glasses; and plastics;

(2) for the deposition of highly optically transparent, highly abrasion-resistant coatings on optically transparent plastic substrates such as lenses;

(3) for the deposition of optically transparent, very highly wear-resistant coatings on optically transparent glass substrates such as laser bar code scanner windows;

(4) for the deposition of highly abrasion-resistant coatings which is independent of the electrical conductivity and thickness of the substrate;

(5) for the deposition of a protective abrasion-resistant coating onto the surface of a substrate, in which the layer thickness and uniformity of the coating are reproducibly controlled to a high degree of accuracy;

(6) for the application of an abrasion-resistant coating which is highly repeatable and reliable;

(7) a process which is readily scaleable to large areas and has high throughput for mass production;

(8) a process in which the substrate is not limited to any particular material or geometry; and (9) for the protection of a substrate from abrasion, wear and corrosion damage during normal, or severe use conditions, and for significantly extending the lifetime of the substrate.

It has been unexpectedly found that the ion beam deposition process for the manufacture of the coatings of the present invention produced remarkable performance on a variety of substrates, especially soft and temperature sensitive optical materials such as plastic and moderately hard and temperature insensitive optical materials, such as glass. The remarkable performance compared to prior art techniques is the result of the combination of the critical features and attributes listed below. The method of the present invention is capable of:

(1) Overcoming the difficulties in obtaining an atomically clean surface by sputter-etching the substrates using an ion beam of controlled shape, current, and energy. The ion beam "shape" is controlled by focusing the beam with electrostatic or magnetic fields. In this way, the beam can be efficiently delivered to the substrates to be processed, with maximum utilization. It has been found that a high degree of control of ion beam current and beam energy is consistently achieved which results in a highly repeatable and predictable rate of removal of surface contaminant layers. In addition, the ion beam sputter-etching process is conducted in high vacuum conditions, such that oxidation or contamination of the surface with residual gases in the coating system is negligible. Finally, the apparatus geometry can be easily configured such that the sputtered contaminants deposit on the vacuum chamber walls, and they do not re-deposit onto the surface of the part as it is being sputter-etched.

(2) Producing excellent adhesion of the protective ion beam deposited layer(s) by generating an atomically clean surface prior to the deposition of the coating. For most applications, the deposited protective layer contains silicon. For applications in which the topmost layer of the coating does not contain silicon, adhesion can be enhanced via the use of silicon-containing adhesion-promoting interlayers between the top coating, e.g. DLC, and the substrate. In either case, the ion beam deposited layer is preferably deposited immediately upon completion of the ion beam sputter-etching step to achieve maximum adhesion to the substrate. Deposition of the coating layer(s) immediately upon completion of the ion beam sputter-etching step minimizes the possibility for re-contamination of the sputter-etched surface with vacuum chamber residual gases or other contaminants. The silicon-containing layers include a variety of amorphous materials, such as silicon oxide, silicon nitride, silicon oxy-nitride, silicon carbide, silicon oxy-carbide, silicon carbonitride, silicon oxy-carbonitride, the so-called silicon-doped DLC, mixtures thereof and chemical combinations thereof. Each of the silicon-containing interlayers may contain hydrogen.

(3) Controlling and minimizing excessive compressive stress in the coatings deposited by the method of the present invention allows for the deposition of highly adherent coatings.

(4) Producing highly dense ion beam protective coatings. This makes the coatings excellent barriers to water vapor and oxygen. The high density of the ion beam deposited coatings presumably results from the extremely high degree of ion bombardment during film growth, compared to prior art methods.

(5) Producing a coating in which its properties do not change with layer thickness as is found for the prior art RF plasma deposition processes. This attribute is achieved because the coating deposition step is conducted with a charge neutralized ion beam. The charge neutrality of the ion beam deposition process also allows for coating of parts with complex geometry without interference to the process. Parts of varying geometry can be coated within a single coating run with no adverse effect on the deposition conditions. For example, lenses of various sizes and shapes can easily be coated with the same coating material in the same run. The ease of fixturing substrates for coating is one of the highly important technical advantages and distinguishing features of the present invention.

(6) Coating all portions of substrates, which contain electrically conducting and electrically insulating materials, with the same high-quality coating. In the case of the plasma deposition methods, DLC coatings of different properties may be deposited on different locations of the same substrate, depending upon whether the area being coated is an electrical conductor or an electrical insulator, and upon the electrical connections between the substrates and the vacuum chamber. Substrate conductivity has no effect on the properties of the ion beam deposited coating of the present invention, which is in sharp contrast to that of plasma deposition methods of the prior art.

(7) Obtaining minimal batch-to-batch variation in the properties of the coatings. This is the case because process parameters such as ion energy, ion current density, and deposition chamber pressure are largely de-coupled in the ion beam deposition method of the present invention, and because each of these process parameters can be accurately controlled and reproduced to a high degree of certainty, often to within 1%. In addition, the process endpoint coating thickness is easily defined and reproduced.

(8) Producing part-to-part thickness uniformity, e.g. a variation of less than 2% can be easily achieved. This is the case because of the compatibility of the method of the present invention with commercially available substrate holders incorporating motion, i.e. rotation and/or planetary motion.

(9) Being readily scaled-up to accommodate mass production because large scale ion beam sources are commercially available. For example, commercially available 38 cm ion beam sources have been used to deposit DLC coatings simultaneously over four 18-inch diameter platens with a thickness variation across all parts of less than ±2%. Plasma deposition systems for application of abrasion-resistant coatings are not presently commercially available on this scale.

Figure 1:
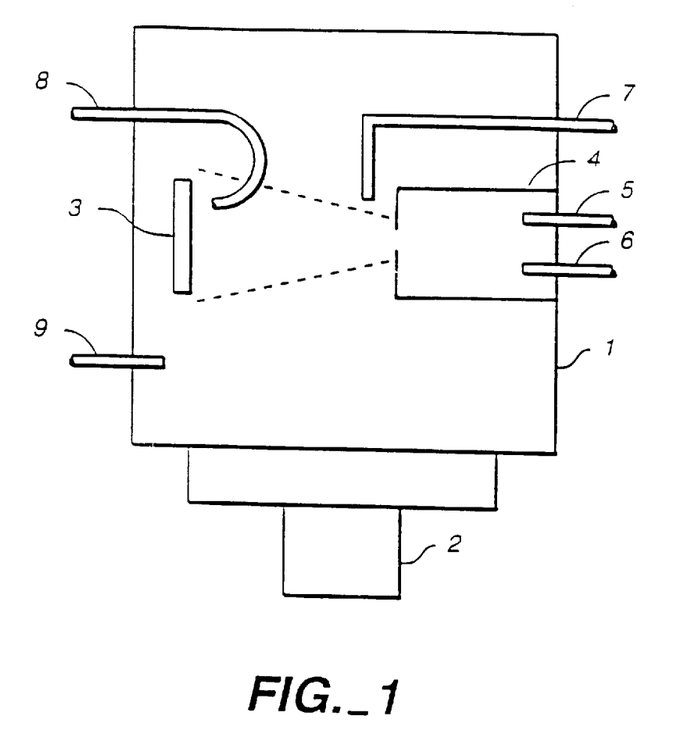
FIG. 1 is a diagrammatic view of an illustrative ion beam deposition apparatus used to manufacture coated substrate products in accordance with the present invention.

The apparatus for carrying out the present invention is illustrated schematically in FIG. 1. The coating process is carried out inside a high vacuum chamber 1, which is fabricated according to techniques known in the art. Vacuum chamber 1 is evacuated into the high vacuum region by first pumping with a rough vacuum pump (not shown) and then by a high vacuum pump, 2. Pump 2 can be a diffusion pump, turbomolecular pump, cryogenic pump ("cryopump"), or other high vacuum pumps known in the art. Use of a diffusion pump with a cryogenically cooled coil for pumping water vapor is a preferred high vacuum pumping arrangement for the present invention. The use of cryopumps with carbon adsorbents is less advantageous than other high vacuum pumps because such cryopumps have a low capacity for hydrogen used in the method of the present invention. The low capacity for hydrogen results in the need to frequently regenerate the adsorbent in the cryopumps.

It is understood that the process of the present invention can be carried out in a batch-type vacuum deposition system, in which the main vacuum chamber is evacuated and vented to atmosphere after processing each batch of parts; a load-locked deposition system, in which the main vacuum deposition chamber is maintained under vacuum at all times, but batches of parts to be coated are shuttled in and out of the deposition zone through vacuum-to-air load locks; or in-line processing vacuum deposition chambers, in which parts are flowed constantly from atmosphere, through differential pumping zones, into the deposition chamber, back through differential pumping zones, and returned to atmospheric pressure.

Substrates to be coated are mounted on substrate holder 3, which may incorporate tilt, simple rotation, planetary motion, or combinations thereof. For coating flat articles, such as glass laser bar code scanner windows, flat disc-shaped or cylindrical substrate holders can be used, in combination with simple rotational motion. For coating articles with compound curvature, such as optical lenses, planetary motion is preferable, in combination with flat or domed substrate holders. The substrate holder can be in the vertical or horizontal orientation, or at any angle in between. Vertical orientation is preferred to minimize particulate contamination of the substrates, but if special precautions such as low turbulence vacuum pumping and careful chamber maintenance are practiced, the substrates can be mounted in the horizontal position and held in place by gravity. This horizontal mounting is advantageous from the point of view of easy fixturing of small substrates which are not easily clamped in place. This horizontal geometry can be most easily visualized by rotating the illustration in FIG. 1 counterclockwise by 90 degrees.

Prior to deposition, the substrates are ion beam sputter-etched with an energetic ion beam generated by ion beam source 4. Ion beam source 4 can be any ion source known in the prior art, including Kaufman-type direct current discharge ion sources, radio frequency or microwave frequency plasma discharge ion sources, microwave electron cyclotron resonance ion sources, each having one, two, or three grids, or gridless ion sources such as the Hall Accelerator and End Hall ion source of U.S. Pat. No. 4,862,032; the description of which is incorporated by reference herein. The ion source beam is charge neutralized by introduction of electrons into the beam using a neutralizer (not shown), which may be a thermionic filament, plasma bridge, hollow cathode, or other types known in the prior art. Gridless ion sources are much preferred over the gridded types for carrying out the present invention because they (1) have fewer critical electrically active surfaces, (2) operate more reliably in the optimum deposition environment of the present invention, and (3) generate much higher beam currents at relatively low beam energies (20–200 eV).

Ion source 4 is provided with inlets 5 and 6 for introduction of gases directly into the ion source plasma chamber. Inlets 5 or 6 are used for introduction of inert gases, such as argon, krypton, and xenon, for the sputter-etching. Other non-depositing gases suitable for sputter-etching, for example nitrogen or oxygen, are also introduced through inlets 5 or 6. Additionally, during the sputter-etching step, chemical etchants such as oxygen may also be introduced in inlets 5 or 6, and used independently or mixed with a other gases to provide chemically-assisted sputter-etching, e.g. for plastic substrates.

During coating deposition, inlets 5 or 6 are used for introducing reactive gases such as oxygen, nitrogen, hydrogen, and ammonia, and can also be used to introduce precursor gases such as hydrocarbons (e.g., methane, acetylene, cyclohexane), siloxanes and silazanes directly into the ion source plasma. Direct injection of depositing gases, i.e., precursor gases, into ion source 4, via inlet 5 or 6 can, however, lead to the formation of insulating layers on critical electrically active surfaces, and thereby disrupt the operation of the ion source. This can be counteracted somewhat by diluting the precursors with non-depositing gases. However, it is much preferred to introduce the depositing gases away from the ion source plasma chamber and into the ion beam by inlet 7. Inlet 7 may contain multiple holes for the introduction of reactive gases, or may be a "gas distribution ring". Finally, reactive gases for the deposition, e.g. oxygen and ammonia, can be introduced at or near the substrate by inlet 8, or into the chamber background by inlet 9. The reactive gases introduced by inlet 8 modify the properties of the coating by chemical reaction at the surface of the coating during deposition.

Additionally, to improve the deposition rate and throughput of the coating machine, multiple ion sources 4 can be utilized and operated simultaneously. Operation of the ion sources can be sequenced for the case in which different coating materials are deposited from each ion source. As described in U.S. Pat. No. 4,490,229, an additional ion source (not shown) can be used to co-bombard the substrates during coating deposition to alter the film properties.

According to the method of the present invention, the substrate is first chemically cleaned to remove contaminants, such as residual hydrocarbons and other contaminants, from the substrate manufacturing and handling processes. Ultrasonic cleaning in solvents, or other aqueous detergents as known in the art is effective. Details of the cleaning procedure depend upon the nature of the contamination and residue remaining on the part after manufacture and subsequent handling. It has been found that it is critical for this chemical cleaning step to be effective in removing surface contaminants and residues, or the resulting adhesion of the coating will be poor.

In the second step of the process, the substrate is inserted into a vacuum chamber, and the air in said chamber is evacuated. Typically, the vacuum chamber is evacuated to a pressure of $1 \times 10^{-5}$ Torr or less to ensure removal of water vapor and other contaminants from the vacuum system. However, the required level of vacuum which must be attained prior to initiating the next step must be determined by experimentation. The exact level of vacuum is dependent upon the nature of the substrate material, the sputter-etching rate, the constituents present in the vacuum chamber residual gas, and the details of the coating process. It is not desirable to evacuate to lower pressures than necessary, as this slows down the process and reduces the throughput of the coating system.

In the third step of the process, the substrate surface is bombarded with a beam of energetic ions from an ion beam to assist in the removal of residual contaminants, e.g. any residual hydrocarbons, surface oxides and other contaminants, not removed in the first step, and to activate the surface. By the term "ion beam", it is intended to mean a beam of ions generated from a plasma which is remote from the substrate. The ions can be extracted from the plasma by a variety of techniques which include, but are not limited to the use of electrostatic grids which are biased to promote extraction of positive ions, e.g. Kaufman-type ion source, or magnetic fields coupled with electrostatic fields, e.g. End Hall-type ion source and Hall accelerators. After extraction, the ions are directed from the ion source toward the substrates due to the potential difference between the source of the ions (plasma) and the samples, typically at or near ground potential. The ion beam is typically charge neutralized with electrons obtained from a variety of possible sources including but not limited to a thermionic hot filament, a plasma bridge neutralizer or a hollow cathode. Charge neutralization of the ion beam allows the processing of electrically insulating substrates in a very stable fashion since the potential of the substrate is maintained. Typical pressures in the deposition zone around the substrate for the invention are in the range of about $10^{-6}$ Torr to about $5 \times 10^{-3}$ Torr so that ion-gas collisions can be minimized, thereby maintaining the high energy ion bombardment of the surface which is necessary for the formation of dense, hard coatings. This sputter-etching of the substrate surface is required to achieve high adhesion between the substrate surface and the coating layer(s). The sputter-etching is effectively carried out with gases such as oxygen, nitrogen, argon, krypton, and xenon. Additionally, hydrogen and oxygen may be added to the ion beam to assist in activation of the surface. The sputter-etching source gas can be introduced in a variety of different ways, including direct introduction into the plasma chamber of the ion source, introduction near the ion source but not directly into the source, i.e. through inlet 7, or introduction into a location remote from the source, as the vacuum chamber background gas through inlet 9. In order to achieve efficient and rapid ion sputter-etching, the sputter-etching source gas is introduced directly into the plasma chamber of the ion source. Typically an ion beam energy greater than 20 eV is selected. Ion energies as high as 2000 eV can be used, but ion beam energies less than 500 eV result in the least amount of atomic scale damage to the substrate.

Immediately after the substrate surface has been sputter-etched, a coating layer is deposited on the substrate by a beam of ions containing two or more of the elements of C, Si, H, O, N or subgroups of these elements. The ion beam is generated by introducing precursor gases containing two or more of the elements of C, Si, H, O, N or subgroups of these elements into the ion source plasma, near the ion source plasma, or remote from the ion source plasma, but the most effective method is to introduce the precursors away from the ion source plasma chamber and directly into the ion beam. These precursor gases may be blended with other inert gases, e.g. argon. The precursor gases undergo "activation" in the ion source plasma or in the ion beam itself. Examples of "activation" include, but are not limited to simple electronic excitation, ionization, chemical reaction with other species, ions and neutrals, which may be electronically excited, and decomposition into simpler ionic or neutral species which may be electronically excited. Ions are extracted from the remote plasma to form an ion beam which is charge neutralized by addition of electrons. Some of these activated precursor species then condense on the surface of the substrate to be coated. The ions strike the surface with energies from 10 to 1500 eV. The ion impact energy depends on the electric field between the point of origin of the ion and the sample, and the loss of energy due to collisions which occur between the ion and other ionic or neutral species prior to the impingement of the ion onto the substrate. The neutrals will strike the surface with a variety of energies, from thermal to 100's of eV, depending on the origin of the neutral. This highly energetic deposition process produces highly adherent, very dense and hard coatings on the substrate surface. The density, hardness and other properties of the coating are all very dependent on the energetics of the deposition process as well as the precursor gases used.

For the direct ion beam deposition method of the present invention, gridless ion sources are more effective than the gridded variety. The number of critical electrical components is greater in gridded sources, and thus they require complex and costly controllers. Not only do the gridded sources have one or more electrostatic grids for extracting and controlling the ion beam, they also require an independent electron source for charge neutralization. In gridless ion sources one electron source, such as a hollow cathode, can simultaneously generate the ion source plasma and neutralize the beam. During coating deposition, this additional electronic complexity makes the gridded ion source more vulnerable to failure, due to the increased probability of formation of insulating deposits on its many critical electrically active surfaces. In addition, beam extraction in gridded sources is severely limited at relatively low beam energies (20–200 eV) by space charge effects.

The following describes several different forms of the ion beam deposited, abrasion-resistant coating. In the first and simplest case, the deposition process conditions are not changed during the coating process, resulting in a single layer coating. The thickness of this layer can be from about 50 Å to about 100 microns, depending on the degree of abrasion protection required by the application. Generally, thicker coatings provide greater wear and abrasion-resistance.

In the second case, it is desirable to provide multiple coating layers on a substrate. One example of this situation is the case of a plastic ophthalmic lens with an anti-reflective coating. For this case, a thick, transparent coating is first deposited to provide abrasion resistance in accordance with the first preferred embodiment of the present invention. Subsequently, using the process of the present invention, materials with different indices of refraction are then made simply by varying the deposition conditions such as precursor gas composition or ion beam energy. By alternating layers of precise thicknesses and sufficiently different refractive indices on top of the thick layer, an anti-reflective coating is created. The range of suitable layer thicknesses and refractive indices are well known in the prior art. In this way, a highly abrasion-resistant, anti-reflective plastic lens product is created. Using the same type of layering of materials with different indices one can design specific reflective colors, e.g. quarter-wave stacks, using techniques that are well known in the prior art.

The third case is applicable in situations where the hard, abrasion-resistant, or low-friction layer does not adhere well to the substrate. In this situation, it is desirable to use a first adhesion-promoting layer or interlayer. Such a layer may utilize different precursor gases or different deposition conditions in order to enhance chemical bonding of the abrasion-resistant, or low-friction layer to the substrate, or to reduce film stress to enhance adhesion to the substrate. Therefore, the first layer must adhere well to the substrate and the subsequent, abrasion-resistant layer must adhere well to the first layer. For this situation, a thin (less than 1 micron) adhesion promoting layer is typically used with a thick (about 2 to about 100 microns) abrasion-resistant outer layer on top.

There are other cases in which a thick, abrasion-resistant layer may be lacking in some other property, such as low friction, so that one or more additional top coatings are required. An example of this situation is discussed in Kimock et al., U.S. Pat. No. 5,268,217, for coated wear resistant glass bar-code scanner windows. For this product, a thick, hard, silicon oxy-nitride coating layer material which is abrasion-resistant under most conditions is used. When a piece of glass is rubbed over the silicon oxy-nitride layer, glass debris is left on the surface of the coating due to the high friction between glass and silicon oxy-nitride. If a thin layer of low-friction DLC or other low-friction material is deposited over the silicon oxy-nitride, rubbing with glass does not leave debris on the surface. The second preferred embodiment of the present invention can be used to generate an optically-transparent wear-resistant coating, suitable for the laser bar code scanner window application. This embodiment consists of an adhesion layer, a thick, very hard interlayer, e.g. silicon oxy-nitride, silicon oxy-carbonitride and the low-friction, DLC top layer. Additionally, the DLC could be deposited by other known methods. Finally, other low-friction top layers such as boron nitride, tin oxide, indium tin oxide, aluminum oxide, and zirconium oxide can be used.

DLC is an outstanding abrasion-resistant material. Therefore, for cases where an extremely hard, inert, abrasion-resistant coating is required, DLC is a preferred coating. It has been found that deposition of silicon-containing interlayer materials onto the substrate prior to deposition of the DLC layer results in highly adherent DLC coatings with outstanding wear resistance properties. It is currently believed that reaction between silicon atoms in the interlayer material and the carbon atoms in the DLC layer is critical for the DLC coating to exhibit excellent adhesion. Direct ion beam deposition of interlayers containing silicon and one or more of the elements hydrogen, oxygen, carbon, and nitrogen can be performed by the present invention by operating ion source 4 on gases which contain these elements. For example, ion source 4 can be operated on diethylsilane gas to produce an interlayer containing silicon, carbon, and hydrogen. The thickness of these interlayers is typically in the range of about 10 Å to 1 micron in thickness.

The silicon-containing layers of the present invention, previously referred to, contain the following combinations of elements: Si and C; Si, C and H; Si and N; Si, N and H; Si and O; Si, O and H; Si, O and N; Si, O, N and H; Si C, H and N; Si, C, H and O; Si, C and N; Si, C and O; Si, O, C and N; and Si, C, H, O and N, may be referred by the names of amorphous silicon carbide, silicon nitride, silicon oxide, and silicon oxy-nitride, and mixtures thereof and chemical combinations thereof, such as "silicon carbonitride", "silicon oxy-carbide", and "silicon oxy-carbonitride". By "silicon carbide", it is meant to include materials which are composed of the elements silicon and carbon, and possibly hydrogen. Stoichiometric and non-stoichiometric amounts of silicon and carbon are included in the definition of this silicon carbide material. By "silicon nitride", it is meant to include materials which are composed of the elements silicon and nitrogen, and possibly hydrogen. Stoichiometric and non-stoichiometric amounts of silicon and nitrogen are included in the definition of this silicon nitride material. By "silicon oxide", it is meant to include materials which are composed of the elements silicon and oxygen, and possibly hydrogen. By "silicon oxy-nitride", it is meant to include materials which are composed of the elements silicon, oxygen, and nitrogen, and possibly hydrogen. Materials falling under the chemical formula $SiO_xN_yH_z$ are considered to be within the definition of this silicon oxy-nitride material. The amorphous silicon oxy-carbide (Si, O, C, H) and silicon oxy-carbonitride (Si, O, C, N, and H) materials deposited by the process of the first preferred embodiment of the present invention are particularly advantageous as abrasion-resistant coatings for plastic substrates. The amorphous silicon oxy-nitride (Si, O, N, H), and silicon oxy-carbonitride (Si, O, C, N, H) materials deposited by the process of the second preferred embodiment of the present invention are particularly advantageous as wear-resistant coatings for glass substrates.

It is advantageous to deposit the DLC layer immediately following the deposition of the adhesion promoting layer to minimize the possibility of re-contamination of the interlayer surface with vacuum chamber residual gases or other contaminants. The thickness of the ion beam deposited DLC coating can be between 50 Å and approximately 100 microns. Thinner DLC coatings, on the order of 50 Å are useful when the main function of the DLC is to provide a low friction surface, or chemical protection. Thicker DLC layers are useful when the protection from severe abrasion is required.

Several ion beam deposition methods may be used for the formation of the DLC coatings of the present invention, including direct ion beam deposition, and direct ion beam deposition with ion assist as in U.S. Pat. No. 4,490,229, referred to above.

For sake of process simplicity, rapid deposition, and ease of scale-up to mass production, direct ion beam deposition from a hydrocarbon gas source is the most preferred DLC deposition process for this invention. Methane or cyclohexane are preferred as the hydrocarbon source gases, but other hydrocarbon gases, such as acetylene, butane, and benzene can be used as well. Hydrogen and inert gases, e.g. argon, krypton, and xenon, may be introduced into the ion source plasma to modify the DLC film properties. The ion energy used in the DLC deposition process may be in the range of approximately 20 eV to approximately 1000 eV. Ion energies in the range of 20 eV to 300 eV are most preferred to minimize heating of the substrate during deposition.

Once the chosen thickness of the top coating layer has been achieved, the deposition process on the substrates is terminated, the vacuum chamber pressure is increased to atmospheric pressure, and the coated substrates are removed from the vacuum chamber.

The examples which follow illustrate the superior performance of the method of this invention. The examples are for illustrative purposes only and are not meant to limit the scope of the claims in any way.

EXAMPLE A

A three inch diameter Si(001) wafer and a 1"×1" piece of fused silica were cleaned in isopropyl alcohol, dried with nitrogen gas and mounted onto a graphite disk using Kapton tape. The graphite plate was mounted into a stainless steel vacuum chamber pumped by a 10" diffusion pump and the chamber was evacuated to a pressure of $9.2 \times 10^{-6}$ Torr. The substrates were sputter-etched for one minute by an argon ion beam generated from an End Hall ion source (manufactured by Commonwealth Scientific as Mark II) operated on 5 sccm of argon, at an anode potential of 171 volts, and an anode current of 1.08 amps. The Ar gas was introduced directly into the plasma chamber of the ion source. The pressure in the chamber was $7.4 \times 10^{-5}$ Torr. A hot filament was used as the electron source. After sputter-etching, methane gas was introduced directly into the plasma chamber of the ion source at a flow of 10 sccm resulting in a pressure of $6.6 \times 10^{-5}$ Torr. The anode voltage was 172 volts and the anode current was 1.08 amps. After 5 minutes of operation at these conditions, an adherent 2880 Å thick DLC coating was deposited. The compressive stress of the coating was $1.5 \times 10^{10}$ dynes/cm². The coating on the fused silica substrate was brown in color when viewed in visible light.

EXAMPLE B

A three inch diameter Si(001) wafer and a 1"×1" piece of fused silica were cleaned in isopropyl alcohol, dried with nitrogen gas and mounted onto a graphite disk using Kapton tape. The graphite plate was mounted into a stainless steel vacuum chamber pumped by a 10" diffusion pump and the chamber was evacuated to a pressure of $2.3 \times 10^{-6}$ Torr. The substrates were sputter-etched for two minutes by an argon ion beam generated from the End Hall ion source (Commonwealth Scientific's Mark II) operated on 5 sccm of argon, at an anode potential of 170 volts and an anode current of 1.25 amps. The argon gas was introduced directly into the plasma chamber of the ion source. The pressure in the chamber was $4.8 \times 10^{-5}$ Torr. A hot filament was used as the electron source. After sputter-etching, the argon was shut off and cyclohexane gas was introduced directly into the plasma chamber of the ion source resulting in a chamber pressure of $1.4 \times 10^{-4}$ Torr. The anode voltage was 26.6 volts and the anode current was 1 amp. After 15 minutes of operation at these conditions, a 2650 Å thick DLC coating was obtained. The coating had a compressive stress of $3.6 \times 10^9$ dynes/cm$^2$. The film on the fused silica substrate was yellow in color when viewed in visible light.

EXAMPLE C

A three inch diameter Si(001) wafer and a 1"×1" piece of fused silica were cleaned in isopropyl alcohol, dried with nitrogen gas and mounted onto a graphite disk using Kapton tape. The graphite plate was mounted into a stainless steel vacuum chamber pumped by a 10" diffusion pump and the chamber was evacuated to a pressure of $2.5 \times 10^{-6}$ Torr. The substrates were sputter-etched for two minutes by an argon ion beam generated from the End Hall ion source (Commonwealth Scientific's Mark II) operated on 6.4 sccm of argon, at an anode potential of 160 volts and an anode current of 0.98 amp. The Ar gas was introduced directly into the plasma chamber of the ion source. The pressure in the chamber was $2.1 \times 10^{-4}$ Torr. A hot filament was used as the electron source. After the sputter-etching was complete, tetramethylcyclotetrasiloxane was introduced into the plasma chamber of the ion source and the argon was turned off resulting in a chamber pressure of $6.7 \times 10^{-5}$ Torr. The source was operated at an anode potential of 100 volts at a current of 1.56 amps (ion beam current approximately 0.31 amp). After four minutes of operation at these conditions, the source was shut off and allowed to cool, and the chamber was vented. The coating deposited was adherent and 3775 Å thick, and the compressive stress of the coating was $1.05 \times 10^{10}$ dynes/cm$^2$. The deposition rate was approximately 945 Å/min. The coating was optically clear to visible light and had a refractive index of 1.8.

EXAMPLE D

A 1"×1" piece of fused silica, a CR-39 lens, a 2"×2"×0.125" CR-39 sample, a 2"×2"×0.125" polycarbonate sample, and a piece of Si were all cleaned in isopropyl alcohol and blown dry with nitrogen gas. The samples were mounted onto an 18-inch diameter aluminum plate which was subsequently mounted in a stainless steel vacuum chamber pumped by a 10" diffusion pump and the chamber was evacuated to a pressure of $2.4 \times 10^{-6}$ Torr. These substrates were sputter-etched for 10 minutes by an argon ion beam generated from the End Hall ion source (Commonwealth Scientific's Mark II) operated on 4.7 sccm of argon gas, at an anode voltage of 150 volts and an anode current of 1.02 amps. The argon gas was introduced directly into the plasma chamber of the ion source. The chamber pressure was $1.1 \times 10^{-4}$ Torr. After this sputter-etch, the argon flow was increased to 37.5 sccm and the anode voltage was reduced to 50 volts. Hexamethyldisiloxane vapor was introduced into the argon ion beam through a nozzle located approximately 1" downstream of the ion source plasma. The pressure in the chamber was $1.4 \times 10^{-3}$ Torr. The ion source was then operated at an anode current of 5.10 amps. After 30 minutes of deposition at this condition, an adherent coating of 2500 Å thickness was obtained. In visible light, the coating appeared yellow in color on the fused silica substrate.

EXAMPLE E

A 1"×1" piece of fused silica, a CR-39 lens, a 2"×2"×0.125" CR-39 sample, a 2"×2"×0.125" polycarbonate sample, and a piece of Si were all cleaned in isopropyl alcohol and blown dry with nitrogen gas. The samples were mounted onto an 18" diameter aluminum plate which was subsequently mounted in a stainless steel vacuum chamber which was pumped by a 10" diameter diffusion pump and the chamber was evacuated to a pressure of $2 \times 10^{-5}$ Torr. The substrates were sputter-etched for 5 minutes by an argon ion beam generated from the End Hall ion source (Commonwealth Scientific's Mark II) operated on 14 sccm of argon gas (introduced directly into the plasma chamber of the ion source), at an anode voltage of 115 volts and an anode current of 3.56 amps. The pressure in the chamber was $2.5 \times 10^{-4}$ Torr. The electron source was a hollow cathode operated on 3 sccm of argon gas. After this sputter-etch, the argon flow was decreased to 7 sccm and the anode voltage was reduced to 67 volts and hexamethyldisilazane was introduced into the argon ion beam through a nozzle approximately 1" downstream of the ion source. The ion source was operated at 5.1 amps current, and the deposition was continued for 30 minutes. The chamber pressure was $1.1 \times 10^{-3}$ Torr. An adherent, 2.1-micron thick film was obtained which was very transparent and water-clear when viewed in visible light.

EXAMPLE F

A 1"×1" piece of fused silica and a 3" diameter Si(001) wafer were cleaned in isopropyl alcohol and blown dry with nitrogen gas. The samples were mounted onto a 6" diameter graphite plate which was subsequently mounted in a stainless steel vacuum chamber, and the vacuum chamber was evacuated to a pressure of $1.3 \times 10^{-5}$ Torr using a 10" diffusion pump. The samples were sputter-etched for 30 seconds with a 500 eV, 137 mAmp (mA) argon ion beam generated in Kaufman-type ion source with 11 cm diameter grids. After sputter-etching the substrates, tetraethoxysilane was introduced into the ion source after the argon was turned off. The ion source was operated for 10 minutes at an anode potential of 500 volts and a beam current of 62 mAmps. An adherent coating of 2300 Å thickness was deposited. The compressive stress of the coating was $6.1 \times 10^9$ dynes/cm$^2$. The coating appeared yellow in visible light.

EXAMPLE G

Two 2"×2"×0.125" CR-39 flat substrates, a CR-39 lens, a 2"×2"×0.125" polycarbonate substrate and a 3" diameter Si(001) wafer were ultrasonically cleaned in isopropanol followed by drying with nitrogen gas. The samples were mounted on an 18" diameter aluminum plate with Kapton tape and the plate was mounted in a stainless steel vacuum chamber which was subsequently evacuated to a pressure of $4.4 \times 10^{-5}$ Torr by a 10" diameter diffusion pump. The samples were sputter etched for 5 minutes with an argon ion beam generated in the End Hall ion source (used in the above examples) using 10 sccm argon gas introduced directly into the plasma chamber of the ion source. The anode potential was 30 volts while the current was 5.8 amps. The electron source for the End Hall ion source was a hollow cathode operated on 3 sccm argon gas. After sputter-etching the substrates, approximately 16 sccm of octamethylcyclotetrasiloxane was introduced into the argon beam through nozzles located approximately 1" downstream of the ion source. The anode potential was 58 volts while the anode current was 5.8 amps. After operating for 3.5 minutes with these conditions, 10 sccm of oxygen gas were introduced. After operating for an additional 30 seconds, the oxygen flow was increased to 30 sccm. After an additional 30 seconds, the oxygen flow was increased to 50 sccm. After an additional 30 seconds, the oxygen flow was increased to 70 sccm and the argon was shut off. The anode potential was 56 volts and the anode current was 5.72 amps. The chamber pressure was $1.45 \times 10^{-3}$ Torr. The ion source plasma and ion beam were extinguished 40 minutes after the first introduction of the octamethylcyclotetrasiloxane. The chamber was brought to atmospheric pressure and the samples were removed. The coated samples were water-clear when viewed in visible light. Approximately 5.5 microns of coating was deposited onto the samples.

The stress of the coating was $7.7 \times 10^8$ dynes/cm$^2$. The haze measured on the CR-39 samples was less than 0.4%. The 2"×2"×0.125" piece of coated CR-39 was tested with a Taber abrader using 500 grams load with CS-10F wheels (total of 1 kg load). After 500 cycles, the change in haze was determined to be 0.65%. Glass tested in an identical fashion had a change in haze of 0.69% after 500 cycles. The coating contained silicon, oxygen, carbon and hydrogen (Si, O, C and H).

EXAMPLE H

Two CR-39 lenses, and two CR-39 2"×2"×0.125" pieces were ultrasonically cleaned in isopropanol and then dried using nitrogen gas. The samples were mounted on an 18" diameter aluminum disk with Kapton tape. The disk was mounted into a stainless steel vacuum chamber which was pumped with a 10" diffusion pump. The chamber was evacuated to a pressure of $1.6 \times 10^{-5}$ Torr. The samples were sputter-etched for 5 minutes using an argon ion beam generated in the End Hall ion source (used in the above examples) with 17.4 sccm of argon gas directly into the plasma chamber of the ion source, an anode potential of 80 volts, and an anode current of 4.22 amps. The electron source for the End Hall ion source was a hollow cathode. A shutter was then placed between the ion source and the substrates to block the ion beam, and 100 sccm of oxygen gas was run into the plasma chamber of the ion source, the argon was turned off, and octamethylcyclotetrasiloxane was allowed into the chamber through nozzles located approximately 1" downstream of the ion source. The anode potential was 72 volts and the anode current was 5.57 amps. The pressure during this process was $1.25 \times 10^{-3}$ Torr. After 72 minutes of operation at this condition, the ion source plasma and ion beam were extinguished and the chamber was brought to atmospheric pressure, and the substrates were removed. The samples were water-clear in visible light. The coating thickness was 7.6 microns and the compressive stress was $5.7 \times 10^8$ dynes/cm$^2$. The hardness of the coating (measured by nanoindentation) was 3.4 GPa. For reference, the hardness of quartz measured by the same technique was 10 GPa.

EXAMPLE I

Two pieces of Si and six metal alloy substrates were ultrasonically cleaned in trichloroethane followed by isopropanol and then dried with nitrogen gas. The parts were mounted on a 6" diameter graphite plate using Kapton tape. The fixture was mounted into a stainless steel vacuum chamber which was pumped by a 10" diffusion pump. The chamber was evacuated to a pressure of $1.0 \times 10^{-5}$ Torr. The samples were sputter etched with an argon ion beam generated by a 11 cm Kaufman-type ion source operated with 6 sccm of argon, at an anode potential of 500 volts and a beam current of 137 mAmps for two minutes. The chamber pressure was $1.3 \times 10^{-4}$ Torr. After sputter-etching, approximately 200 Å layer of Si was deposited by ion beam sputtering from a Si target. A 1000 eV, 0.1 amp ion beam from a 5 cm Kaufman-type ion source was operated on 7 sccm of Ar gas were used to sputter the Si target for 1.5 minutes. After deposition of the Si layer, the 11 cm ion source was operated on 12 sccm of methane gas and approximately 12 sccm of diethylsilane gas at an anode potential of 500 volts and a beam current of 0.185 amp for 71 minutes. The chamber pressure was $1.4 \times 10^{-4}$ Torr. The ion source plasma and ion beam were extinguished and the chamber was brought to atmospheric pressure and the samples were removed. The samples were coated with 2 microns of a coating containing carbon, silicon, and hydrogen. The coating appeared shiny black in visible light and had a Nanoindentation hardness of 13 GPa.

EXAMPLE J

Two 2"×2"×0.375" pieces of common float glass are ultrasonically cleaned in isopropanol. The substrates are then mounted onto an aluminum disk with Kapton tape and the disk is mounted into a stainless steel vacuum chamber. The chamber is evacuated to a pressure of $5 \times 10^{-6}$ Torr. The glass is sputter-etched with an argon ion beam generated in an End Hall ion source operating on argon gas which is introduced directly into the plasma chamber of the ion source. The samples are sputter-etched for two minutes with the anode potential at 50 volts and the anode current at 5 amps. The electron source for the ion beam source is a hollow cathode operating on argon and the chamber pressure is $5 \times 10^{-4}$ Torr. After sputter-etching, the argon is turned off and 50 sccm of oxygen gas are introduced into the plasma chamber of the ion source. Additionally, 50 sccm of silane are introduced through a nozzle 1" downstream of the ion source. The anode potential is 50 volts and the anode current is 5 amps. These conditions result in deposition of an amorphous $SiO_2$-like film on the substrates. These conditions are maintained for 3 minutes. Then, 50 sccm of ammonia gas are introduced into the plasma chamber of the ion source and the oxygen gas flow is reduced to 5 sccm. The anode potential is 50 volts and the anode current is 5 amps. These conditions produce a silicon-oxy-nitride-like coating material on the substrate. After operation at these conditions for 2 hours, the silane, ammonia, and oxygen gas flows are turned off, and 20 sccm of methane gas is introduced into the plasma chamber of the ion source. The anode potential is 50 volts and the anode current is 5 amps. These conditions produce a DLC coating on the substrate. After operation at these conditions for 2 minutes, the ion source plasma and ion beam are extinguished, the chamber is brought to atmospheric pressure, and the coated glass windows are removed. The total thickness of the coating is 5.5 microns and contains carbon, silicon, hydrogen, oxygen and nitrogen. The samples have a very light brown color when viewed in visible light. The adhesion, abrasion resistance, and chemical resistance of the coating are excellent.

The above Example J process produces a glass substrate with a first layer of amorphous silicon oxide-like material (thickness less than 2,000 Å), a second thick layer of amorphous silicon oxy-nitride material, and a thin (200 Å thick) top layer of DLC.

EXAMPLE K

One glass and one polysiloxane-coated polycarbonate sunglass lens are ultrasonically cleaned in isopropanol and blown dry with nitrogen gas. The lenses are mounted on an aluminum disk with Kapton tape and mounted into a stainless steel vacuum chamber. The chamber is evacuated to a pressure of $5\times10^{-6}$ Torr. The samples are sputter-etched with an argon ion beam generated by the End Hall ion source (used in the above examples) operated on argon introduced directly into the plasma chamber of the ion source with an anode potential of 50 volts and an anode current of 5 amps for 2 minutes. The electron source for the ion beam source is a hollow cathode operated on argon gas. After sputter-etching, the argon is turned off and 50 sccm oxygen are introduced directly into the plasma chamber and 50 sccm of silane are introduced through a nozzle 1" downstream of the ion source. The anode potential is 50 volts and the anode current is 5 amps. These conditions result in deposition of an amorphous silica-like material on the substrate. After operation at these conditions for 2 minutes, the silane and oxygen gases are turned off, and 20 sccm of methane gas are introduced directly into the plasma chamber of the ion source. The anode potential is 50 volts and the anode current is 5 amps. These conditions produce a DLC coating on the surface of the substrate. After operation at these conditions for 10 minutes, the ion source plasma and ion beam are extinguished, the chamber is brought to atmospheric pressure, and the lenses are removed. The lenses have a gold-brown reflected color when viewed in visible light. The coating has excellent adhesion, abrasion-resistance, and chemical resistance.

The Example K process described above provides a coated sunglass lens with a 500 Å-thick layer of amorphous silica-like interlayer material and a 1000 Å-thick layer of DLC.

EXAMPLE L

Two 2"×2"×0.125" CR-39 flat substrates, a CR-39 lens, a 2"×2"×0.125" polycarbonate substrate, a 8" diameter× 0.125" thick polycarbonate substrate and a 3" diameter Si(001). wafer were ultrasonically cleaned in isopropanol followed by drying with nitrogen gas. The samples were mounted on 8.5" diameter disks with Kapton tape and the disks were mounted in a stainless steel vacuum chamber on a planetary drive which was subsequently evacuated to a pressure of $5\times10^{-6}$ Torr by a 10" diameter diffusion pump. The samples were sputter etched for 2 minutes with an argon ion beam generated in the End Hall ion source (used in the above examples) using 3 sccm argon gas introduced directly into the plasma chamber of the ion source. The anode potential was 50 volts while the current was 5.6 amps. The electron source for the End Hall ion source was a hollow cathode operated on 3 sccm argon gas. After sputter-etching the substrates, approximately 16 sccm of octamethylcyclotetrasiloxane was introduced into the argon ion beam through nozzles located approximately 1" downstream of the ion source. The anode potential was 59 volts while the anode current was 5.8 amps (ion beam current approximately 1.5 amps). After operating for 3.0 minutes with these conditions, 70 sccm of oxygen gas was introduced into the plasma chamber of the ion source and the argon flow was reduced to 0.0 sccm. The anode potential was 57 volts and the anode current was 5.79 amps (ion beam current approximately 1.5 amps). The chamber pressure was $1.4\times10^{-3}$ Torr. The ion source plasma and ion beam were extinguished 40 minutes after the first introduction of the octamethylcyclotetrasiloxane. The chamber was brought to atmospheric pressure and the samples were removed. The coated samples were water-clear when viewed in visible light. Approximately 4.8 microns of coating was deposited onto the samples.

The stress of the coating was $6.4\times10^8$ dynes/cm$^2$. The tensile strain to microcracking of the coating was determined using a four point bend technique. Coated polycarbonate pieces, 1 cm×10 cm, were cut from the 8" diameter disk and mounted in the four point bend apparatus. The samples were bent until microcracking of the coating was observed. The radius of curvature was measured and the strain was calculated. The results indicate that the strain to microcracking was 2.1–2.2%.

Examples G, H and L are representative of the first preferred embodiment, and demonstrate that the present invention can produce highly optically transparent, water-clear, low stress, adherent, hard, abrasion-resistant coatings containing silicon, carbon, oxygen, and hydrogen on plastic substrates at high deposition rates. For high rate deposition of these materials, the End Hall source is a preferred ion beam source because of its ability to produce high ion beam currents. Additionally, these high ion beam currents are produced at low ion beam energies, which results in reduced substrate heating and other advantageous properties of the coating.

In the first preferred embodiment of the present invention, coatings comprising silicon, oxygen, carbon, and hydrogen are deposited, having the properties of Nanoindentation hardness in the range of about 2 to about 5 GPa and a tensile strain to microcracking greater than about 1%. These coatings comprising silicon, oxygen, carbon, and hydrogen are set forth in detail in the pending application, Ser. No. 08/205,898, filed Mar. 3, 1994 (Docket No. 6051/52638); the details of which are incorporated herein by reference. When applied to plastic substrates, these coatings produced Taber abrasion resistance test results equivalent to that of glass. These coatings are particularly useful in applications where optical plastic substrates require improved abrasion protection (e.g. plastic sunglass or ophthalmic lenses). Example E demonstrated that the invention can produce similar coatings which contain nitrogen.

The properties of the coatings in Examples E, G, H, and L which make them highly attractive and unique are hardness which is much greater than that of plastics such as polycarbonate and CR-39 (typical hardness 0.2–0.3 GPa), or polymer coatings, and high flexibility and high tensile strain to microcracking. Compositionally, the coatings are not SiO$_2$, but rather contain significant amounts (>5 atomic percent) of carbon and, therefore, do not show brittle fracture failure as is exhibited by glass or quartz coatings.

A unique advantage of the use of the ion beam method for producing these materials is the relationship between stress and hardness. It is well known in the prior art that stress and hardness are often strongly related. Typically, the greater the compressive stress, the harder the material. For the case of the Si—O—C—H materials produced by injecting siloxane precursors into an oxygen ion beam, it was unexpectedly found that by increasing the ratio of oxygen to siloxane precursor, the coating hardness was increased, while the compressive stress was simultaneously decreased. By this method, it is possible to produce hard, abrasion-resistant coatings which are under tensile stress, or are nearly stressfree. This is a very unexpected result for an energetic deposition process, and a key technical advantage of the present invention.

It is believed that the reduction in compressive stress with increasing hardness is due to the etching of carbon from the growing surface by the oxygen ions, or activated oxygen in the ion beam. It has been observed by Energy Dispersive X-ray Spectroscopy that the carbon signal in the deposited coatings decreases with increasing oxygen flow rate for a fixed siloxane precursor flow rate. It is believed that the reduction in compressive stress with increasing coating hardness is unique to the ion beam process of the present invention.

Using the process of the present invention, very high deposition rates can be achieved while maintaining low substrate temperature. This invention produces coatings which are very adherent and provide outstanding abrasion protection. For example, coated plastic substrates such as lenses, which have abrasion resistance equal to that of glass can be produced. Because of the high coating deposition rates which can be attained, the invention provides an economical manufacturing process. The process of the present invention is also readily scaled-up to mass production using commercially available equipment.

The second embodiment of this invention generates an optically transparent coating ideally suited for protecting moderately hard and temperature insensitive optical materials, such as glass and glass-ceramics. An example of a glass article, where such a coating is of great utility, is the type of window used in laser bar code scanners found in supermarket checkout lanes. Uncoated bar code scanner windows typically survive only a matter of weeks before scratches from impacting cans and bottles interfere with the laser scanning process. Kimock et al. disclose in U.S. Pat. No. 5,268,217, however, that by coating a bar code scanner window with a composite multilayer coating, consisting of a thin adhesion layer, followed by a thick and hard interlayer, e.g. silicon oxy-nitride, and a thin low-friction top layer of DLC, the lifetime of the window in the supermarket can be extended to >5 years. The key features of such a coated window are (1) a minimum transmission of approximately 75% at 633 nm, (2) haze (i.e., light scattering) of less than approximately 1%, (3) a hard layer thickness greater than about 3 to about 4 micrometers, (4) a composite Vickers microindentation hardness in the range of 1200 $kg/mm^2$ to 1700 $kg/mm^2$ and (5) a coefficient of friction less than about 0.2.

While the method in Example J can be tailored to produce coated glass windows which meet all of the requirements listed above for the laser bar code scanner application, it would be of great advantage from a manufacturing standpoint to replace the pyrophoric silane feed gas used in Example J with a less hazardous silicon-containing feed gas. Volatile organosilicon precursors are an alternative to silane, but when these gases are injected into a plasma environment sufficiently energetic to generate coatings with a hardness within the preferred range, the resulting coatings generally contain a significant "diamond-like carbon component" due to the carbon in these precursors. Because of their high carbon concentration, these coatings are too opaque at the preferred thickness to meet the transmission specification for a laser bar code scanner. It has been found that by introducing the correct combination of organosilicon precursor gases and other gases into the ion beam, and maintaining the substrate temperature in the range of 200°–500° C., highly abrasion resistant, optically transparent coatings suitable for applications such as laser bar code scanner windows can be made by the present invention. Example M, and the discussion which follows, illustrates the preferred operating process for the present invention for manufacture of highly abrasion-resistant coatings on optically transparent substrates such as glass laser bar code scanner windows.

EXAMPLE M

A 3" diameter silicon wafer and a 5.25"×3.25"×0.25" piece of common float glass were cleaned in isopropanol, and then dried with nitrogen gas. The glass substrate was mounted in a stainless steel vacuum chamber, roughly 6" downstream and on beam axis from an End-Hall ion source. The silicon wafer was taped to the side of the glass facing the ion source using small strips of Kapton tape, while a K-type thermocouple was taped to the opposite side. The chamber was evacuated to a pressure of $5\times10^{-5}$ Torr. A plasma within the ion source was then initiated by (a) igniting the electron source, a hollow cathode, and then reducing its argon feed to 18 sccm, (b) introducing 25 sccm argon gas directly into the plasma chamber of the ion source, and (c) applying a potential of 135 V on the ion source anode. The chamber pressure was about $5\times10^{-4}$ Torr. These conditions resulted in an anode current of 16 A, which was maintained at this value during the first 6 steps of the coating process. The purpose of this first step was to warm up the ion source and stabilize its operation.

In the second step after 2 minutes from the start of the process, 50 sccm of oxygen gas was introduced into the plasma chamber of the ion source and the argon flow was then turned off. The anode potential during this second step was about 95 V. The substrates were sputter-etched under these conditions for 10 minutes.

The third step was started by injecting a total flow of 15 sccm of tetramethyldisilazane (TMDSN) into the oxygen beam via two nozzles located approximately 2" from the beam axis and approximately 1" downstream of the ion source. The anode potential was approximately 75 V, and the substrate temperature was about 230° C. These conditions, which produced an amorphous silicon dioxide adhesion layer, were maintained for 1.5 minutes.

In the fourth and fifth steps, each lasting 1.5 minutes, the deposition parameters were transitioned to the hard layer conditions. In the fourth step the total TMDSN flow was increased to 60 sccm, and simultaneously 10 sccm hydrogen and 1 sccm nitrogen were introduced directly into the plasma chamber of the ion source. At this point the chamber pressure increased to about $1\times10^{-3}$ Torr, the anode potential dropped to 65 V, and the substrate temperature was about 245° C. In the fifth step, the hydrogen and nitrogen flows were increased to 60 sccm and 5 sccm, respectively, and the oxygen flow was reduced to 25 sccm. The anode potential now was about 75 V, and the substrate temperature was about 246° C.

In the sixth step, the hard layer conditions were established, by increasing the hydrogen and nitrogen flows to 75 sccm and 7.5 sccm, respectively, and reducing the oxygen flow to 5 sccm. The anode potential at this point was about 100 V, and the substrate temperature during the hard layer step steadily increased from about 250° C. to about 280° C. Five minutes into the sixth step, the beam current was increased to 18 A by increasing the anode potential to about 105 V. After 2 additional minutes, the hard layer deposition was terminated by shutting off the TMDSN flow.

In the seventh step, 40 sccm argon was introduced immediately thereafter into the ion source chamber, the hydrogen and nitrogen flows were turned off, and the beam current was reduced to 5 A. The beam power in this seventh step was maintained at a low level for 3.5 minutes, with an anode potential of about 50 V, in order to allow the substrates to cool down before deposition of a DLC layer was initiated. At the end of the cool-off period, the substrate temperature had decreased to <250° C. At this point, the Ar flow was reduced to 20 sccm, an additional flow of 20 sccm hydrogen was introduced into the ion source chamber, and the anode current was increased to 10 A. The purpose of this seventh step was to stabilize the ion source operation prior to the DLC deposition step. After 1.5 minutes under these conditions, during which the anode potential was approximately 145 V, 20 sccm of methane was introduced directly into the ion source plasma chamber. The anode current was maintained at 10 A, with an anode potential of about 90 V, for 0.5 minutes, before the plasma was extinguished during the eighth and last step of the process.

In this last step, a DLC top coating layer about 150 Å thick was deposited. The chamber was then vented to air and the substrates removed. The total coating thickness ranged from 4.8 micrometers at the corners of the glass to about 6.5 micrometers at the center of the silicon wafer. The coated areas on the glass were clear to light yellow in appearance, and had a minimum transmission of about 80% in the range of about 600 nm to about 700 nm. The Vicker's microindentation hardness, as measured with a load of 25 g, was in the range of about 1550 to about 1650 kg/mm$^2$ over the entire coated surface of the substrates, the coating stress was compressive with a value of $6 \times 10^9$ dynes/cm$^2$, and the static coefficient of friction was measured at about 0.16. The coated glass sample did not abrade when it was forcefully rubbed by hand with another glass article or with 100 grit garnet ($SiO_2$) sandpaper. On the other hand, the same treatment to uncoated areas on the glass resulted in immediate and severe damage. The haze value of this sample was not measured, but values of other samples made in the same manner were typically about 0.10 to about 0.15%.

One of the key features incorporated in Example M, which assists in the deposition of a coating that is both sufficiently hard and optically transparent from an organosilicon feed gas, is the introduction of hydrogen gas into the ion source plasma chamber during interlayer deposition. If undiluted inert gas (Ne, Ar, Kr, and Xe) or undiluted $N_2$ is used instead, then the resulting coatings are found to be black or brown in appearance. If, on the other hand, the ion source is operated with undiluted oxygen, as was the case in Example M during the adhesion layer deposition step, then the coating hardness is at most about 1000 kg/mm$^2$, and typically only about 600 kg/mm$^2$.

While an oxygen ion beam is most effective in reducing the carbon content in a coating deposited from carbon-containing (organosilicon) precursors, both by combustion processes in the ion beam, and by preferentially etching carbon from the surface of the depositing coating, activated oxygen in the beam is invariably incorporated in the coating. Accordingly, at high oxygen-to-organosilicon precursor flow ratios, an amorphous silicon dioxide material is deposited with a maximum Vickers hardness of about 1000 kg/mm$^2$. The presence of hydrogen in the ion beam is believed to reduce the carbon content in the coating in a similar fashion, by reacting both with the organosilicon precursor in the gas phase and with carbon in the depositing coating to form highly volatile hydrocarbon species such as methane and acetylene. The presence of hydrogen, however, does not necessarily lead to hydrogen incorporation in the material and the related reduction in bond order and hardness. To the contrary, atomic hydrogen in the beam may recombine with, and thereby remove bound hydrogen in the coating. Therefore, it is likely that the effect of the hydrogen in the ion beam is to reduce the carbon content in the deposited coating and thereby increase its optical transparency, without unduly increasing the hydrogen content to the point where soft, low bonding order material is produced.

Since the ion source typically cannot be operated with pure hydrogen flowing into the plasma chamber, "plasma maintenance" gases had to be admixed in quantities typically at least ½0th of the total flow. Even in these small amounts, the nature of the maintenance gas had a noticeable effect on the coating properties, with Ar generally yielding slightly darker coatings (than $N_2$), and with $O_2$ yielding coatings that were slightly softer. In fact, addition of small quantities of $O_2$, on the order of about 2 to about 5 sccm, into the ion source chamber along with a larger flow of another maintenance gas, e.g. 10 sccm of $N_2$, was found to be beneficial in that the compressive coating stress decreased without a proportionate decrease in the coating hardness.

A second critical aspect of the method of the second preferred embodiment that allows for deposition of a sufficiently hard and optically transparent coating is the proper selection of the silicon-containing precursor. Suitable organosilicon precursors were found to include, but are not limited to hexamethylcyclotrisilazane (HMCTSN), tetramethylcyclotetrasiloxane (TMCTSO), tetramethyldisiloxane (TMDSO), and tetramethyldisilazane (TMDSN, used in Example M). Inappropriate precursors, which produce layers that are too opaque when made sufficiently thick and hard, include hexamethyldisilazane, octamethylcyclotetrasiloxane, tetrakisdiamethylaminosilane, and tetramethylsilane. The common feature which distinguishes the optimum set of precursors from the inappropriate precursors is the C/Si ratio. For suitable precursors the C/Si ratio is about 2 or less, and for inappropriate precursors, the C/Si ratio is about 3 or greater. This observation strongly supports the contention that it is the carbon content in the coatings produced from organosilicon precursors that determines the coating's optical absorbance.

Other suitable precursors for the method of the second preferred embodiment include silane and disilane. While hard layer materials with properties appropriate for bar code scanner windows could be made from these precursors by flowing exclusively ammonia and oxygen through the ion source plasma chamber as in Example J, it is probable that inclusion of hydrogen gas in this gas stream will improve the optical and mechanical properties by reducing the hydrogen content in the hard layer.

The procedure in Example M was modified slightly when suitable oxygen containing organosilicon precursors (TMCTSO, TMDSO) were employed, so that no additional oxygen was introduced in the ion source plasma chamber during interlayer deposition. Even with this change, the resulting coatings had measured hardnesses near the lower end of the preferred range.

The hard interlayer material formed by the second preferred embodiment is structurally very different from the softer coatings of the first preferred embodiment, although both may contain the same elements (Si, C, O, N, and H). On the one hand, the coatings of the first preferred embodiment can be viewed as "hybrids" between very soft and flexible plasma polymerized siloxanes or silazanes, and moderately hard and brittle amorphous silicon dioxide. On the other hand, the materials produced by the second preferred embodiment can be thought of as a hybrid between amorphous hydrogenated silicon carbide and amorphous silicon oxy-nitride. Both of these materials are much harder than glass (about 600 kg/mm$^2$), with microindentation hardnesses on the order of about 2000 kg/mm$^2$ and about 1400 kg/mm$^2$, respectively. The optical transparency of amorphous hydrogenated silicon carbide, which has a yellow appearance, is generally lower than the optical transparency of amorphous silicon oxy-nitride, which is nearly water-clear.

The high hardness of the interlayer material produced by the second preferred embodiment is indicative that this material has a higher average bond order, i.e., has a higher crosslink density, and has a higher mass density, than the material produced by the first preferred embodiment. Based on ceramics known in the art, it would be expected that this hard material should be more brittle than glass. However, when interlayer coating materials made by the second preferred embodiment were tested by Vickers microhardness indentation, the resultant indents were distorted in a manner consistent with elastic recovery during unloading of the indenter. In contrast, Vickers indents made under identical test conditions on glass or ion beam sputter-deposited amorphous silicon oxy-nitride (as per Kimock, et al, U.S. Pat. No. 5,268,217) were usually perfectly pyramidal in shape. It should be noted that the Vickers hardness values obtained from the distorted indents were consistent with values obtained by Nanoindentation hardness testing (about 12 to about 17 Giga Pascals), where indent dimensions are obtained during loading.

Unlike the case for the deposition of hard layers, the amorphous silicon dioxide adhesion layer can be easily made from a great variety of silicon-containing precursors, provided that during deposition of this layer the ion source is operated with at least some oxygen flowing into its plasma chamber. Suitable DLC layers were made from cyclohexane as well as methane, but other hydrocarbon gases, such as acetylene, butane, and benzene can be used as well. In separate runs, DLC layers were made both by introducing these precursors directly into the ion source plasma chamber, and by injecting the precursors into the ion beam through nozzles downstream of the ion source.

A third critical aspect in the method of the second preferred embodiment of this invention is control of the substrate temperature. It was discovered that when the substrate temperature was lower during the interlayer deposition than the values given in Example M, the deposition rate increased, but the hardness and optical transparency were compromised as well. The minimum substrate temperature at which usable interlayer material with sufficient hardness and optical transparency could be produced was about 200° C. The intensity of the plasma ion beam is sufficient, at distances close to the ion source, to heat small free-standing and stationary substrates to temperatures above this critical value. For example, no additional substrate heating source was used in Example M. When coating large areas, which is best done by incorporating some type of relative motion between the ion source(s) and the substrates, an additional heat source, e.g. one or more infra-red lamps, is required. The inventors believe that it may be possible to further increase the optical transparency of the ion beam deposited coatings after they have been deposited by the method outlined in Example M, by heating the samples (after coating) to temperatures equal to or greater than about 250° C.

The fourth critical parameter in the second preferred embodiment is the output capability of the ion source. It was observed during the course of this work that there was a consistent decrease in the hardness of coatings produced in separate runs where successively lower anode currents were used during the interlayer deposition step. Repeated attempts to produce suitable hard layer materials at 5 A anode current and anode potentials up to 170 V resulted in a Vickers microhardness no greater than 1100 kg/mm$^2$ in coatings with optical transparency sufficient for the bar code scanner application. It was also observed that hardness tended to decrease with the distance between the ion source and the substrate.

Ion beam probe measurements were made to determine typical levels of ion beam current density and ion energy required by the process illustrated in Example M. These measurements were made with a three-grid ion energy analyzer located down stream of the ion source and with hydrogen and nitrogen flows and ratios similar to those used in the coating method of step six in Example M. The ion beam energy spectrum from an End Hall ion source typically has two components, namely: (1) a diffusive, low energy ion beam component which arises from the low pressure diffusive plasma generated outside the anode via electron impact ionization and charge-exchange processes and which has a mean energy of about 5 to about 10 eV, and (2) an energetic ion beam component which arises from ions born within the ion source plasma chamber and which has a mean energy typically in the range of about 30% to about 60% of the anode potential. From the ion beam probe measurements for process conditions similar to those in Example M, it has been found that the energy spectrum of these ion beam components tend to be distributed normally, and thus, the spectral features may be roughly quantified with a mean energy and a full-width-half-maximum (FWHM) energy spread.

Two examples of ion beam characteristics under conditions relevant to the current process are summarized in Table 1 below. The measurements were made on the beam axis and 6" downstream of the ion source, with anode current levels of 5 A and 18 A. The ion source was operated with hydrogen, nitrogen and argon introduced directly into its plasma chamber, while the total gas flow was adjusted to achieve an anode potential near 100 V at the two anode currents used. The small quantity of argon flowing into the ion source plasma chamber stabilized the ion source output, and thereby reduced low frequency noise in the ion beam current measurements. These measurements were made without injecting precursor gases into the ion beam, which otherwise would have covered the measurement probe with a disabling non-conductive coating. The results of these measurements, also displayed in Table 1, indicated a dramatic rise in the ion beam current density ($J_1$ for diffusive beam component and $J_2$ for energetic beam component, in units of mA/cm$^2$) as the anode current was increased from 5 to 18 A. At the same time, the mean energy (<$E_1$> for diffusive beam component and <$E_2$> for energetic beam component, in units eV) of the energetic ion beam component unexpectedly increased from 40% to 56% of the anode potential. Upon the injection of the precursor into the beam, it is likely that the energetic beam component is attenuated somewhat in amplitude and energy as a result of increased scattering of beam ions along the beam path. Also ion beam current densities decrease with the distance downstream from the ion source. For example, beam current densities decrease by a factor of about 60% to about 70% as the distance is doubled from 6" to 12" on axis.

Table 1 below sets forth the ion beam energy distribution features of an End-Hall ion source obtained with a three grid ion energy analyzer 6 inches from the face of the ion source. The chamber pressure was 6×10$^{-4}$ Torr. The ion energy spectrum is characterized by (1) a diffusive beam component and (2) an energetic beam component.

TABLE 1

| Operating Conditions | | | | | Diffusive Beam Component | | | Energetic Beam Component | | |
|---|---|---|---|---|---|---|---|---|---|---|
| $I_{anode}$ | $V_{anode}$ | $H_2$ sccm | $N_2$ sccm | Ar sccm | $J_1$ mA/cm$^2$ | $<E_1>$ eV | $FWHM_1$ eV | $J_2$ mA/cm$^2$ | $<E_2>$ eV | $FWHM_2$ eV |
| 5 | 102 | 80 | 8 | 5 | 0.2 | 11 | 20 | 1.5 | 41 | 36 |
| 18 | 114 | 100 | 10 | 5 | 0.4 | 11 | 20 | 3.9 | 64 | 62 |

The low hardness of coatings produced with the ion source operating at an anode current of 5 A or less, in combination with the measurements described above, indicates that for the process of the current invention, an ion source capable of generating an energetic ion beam with a beam current density at the substrate greater than about 1.5 mA/cm$^2$ is required. It is believed that coatings from silicon-containing precursors cannot be made with sufficient hardness on substrates at temperatures in the range of the second preferred embodiment, in the absence of energetic ion bombardment.

In summary, the key features incorporated in the process illustrated in Example M by which a coating, that is both sufficiently hard and sufficiently optically transparent to meet the laser bar code window specifications outlined above, can be deposited on a substrate in an ion beam are:

(1) a flow of hydrogen gas directly into the ion source chamber during interlayer deposition;

(2) a silicon-containing precursor with a C/Si ratio less than about 3, at least a portion of which is injected into the ion beam downstream of the ion source;

(3) a substrate temperature in the range of about 200° to about 500° C.; and (4) an ion beam in the range of 20–200 eV with a beam current density at the substrate greater than about 1.5 mA/cm$^2$.

From the foregoing description, one of ordinary skill in the art can easily ascertain that the present invention provides an improved method for producing highly protective and abrasion-resistant coatings on a variety of substrates, including optical plastics and glass. Highly important technical advantages of the present invention include outstanding adhesion of the ion beam deposited coatings, outstanding abrasion resistance, and ease and flexibility of mass production.

Without departing from the spirit and scope of this invention, one of ordinary skill in the art can make various changes and modifications to the invention to adapt it to various usages and conditions. As such, these changes and modifications are properly, equitably, and intended to be, within the full range of equivalents of the following claims.

What is claimed is:

1. A method for producing an optically transparent coating on the exposed surface of a substrate comprising in sequence:

(a) chemically cleaning the surface of said substrate to remove residual hydrocarbons and other contaminants;

(b) mounting said substrate in a deposition vacuum chamber and evacuating the air from said chamber;

(c) sputter-etching the surface of said substrate with a beam of ions to further remove residual hydrocarbons and other surface contaminants, and to activate the surface;

(d) plasma ion beam depositing using silicon-containing precursor gases at least one layer of an amorphous material selected from the group consisting of a silicon oxide, silicon carbide, silicon nitride, silicon oxy-carbide, silicon oxy-carbonitride, and silicon oxy-nitride and using a gridless ion source having a plasma chamber therein, wherein a plasma is generated in the plasma chamber and wherein a gas stream containing at least a portion of said precursor gases is introduced outside of the ion source and into the plasma ion beam, and a gas stream containing hydrogen is introduced directly into said plasma chamber during the deposition;

(e) increasing the vacuum chamber pressure to atmospheric pressure; and (f) recovering a coated substrate product with an abrasion resistance greater than the abrasion resistance of glass lenses.

2. The method of claim 1 wherein said silicon-containing precursor gases have a C/Si ratio less than 3.

3. The method of claim 1 wherein a temperature of said substrate during the deposition is about 200° C. to about 500° C.

4. The method of claim 1 wherein said ion beam has a beam current density at said substrate of greater than about 1.5 mA/cm$^2$ and has a mean beam kinetic energy in the range of about 20 eV to about 200 eV.

5. The method of claim 1 wherein said gridless ion source is selected from the group consisting of an End Hall ion source and a Hall accelerator ion source.

6. The method of claim 1 wherein said substrate comprises a material selected from the group consisting of a ceramic, a glass, and mixtures thereof.

7. The method of claim 1 wherein said abrasion-resistant coating includes multiple layers of at least two different refractive indices to reduce reflection at predetermined wavelengths.

8. The method of claim 1 wherein said substrate is an optically transparent material.

9. The method of claim 1 wherein said substrate is an optically transparent lens.

10. The method of claim 1 wherein said substrate is a bar code scanner window.

11. The method of claim 1 wherein said silicon-containing precursor gases are selected from the group consisting of silane, disilane, hexamethylcyclotrisilazane, tetramethylcyclotetrasiloxane, tetramethyldisiloxane, and tetramethyldisilazane.

12. The method of claim 1 wherein said silicon-containing precursor gases are selected from the group consisting of hexamethylcyclotrisilazane, tetramethylcyclotetrasiloxane, tetramethyldisiloxane, and tetramethyldisilazane.

13. A method for depositing onto a parent substrate an optically transparent coating material having at least one amorphous layer consisting of silicon oxy-nitride or silicon oxy-carbonitride which comprises in sequence:

(a) chemically cleaning the exposed surface of said substrate to remove residual hydrocarbons and other contaminants;
(b) mounting said substrate in a deposition vacuum chamber and evacuating the air from said chamber;
(c) sputter-etching the surface of said substrate with a beam of ions to further remove residual hydrocarbons and other surface contaminants, and to activate the surface;
(d) plasma ion beam depositing said amorphous layer onto the surface of said substrate by exposing said substrate to silicon-containing precursors selected from the group consisting of hexamethylcyclotrisilazane, tetramethylcyclotetrasiloxane, tetramethyldisiloxane, and tetramethyldisilazane, whereby said precursor gases are activated by said plasma ion beam and said substrate is bombarded by ions during deposition using a gridless ion source having a plasma chamber therein, wherein a plasma is generated in the plasma chamber and wherein a gas stream containing at least a portion of said precursor gases is introduced outside of the ion source and into the plasma ion beam, and a gas stream containing nitrogen and hydrogen is introduced directly into said plasma chamber during the deposition;
(e) increasing the vacuum chamber pressure to atmospheric pressure; and
(f) recovering a product having an abrasion resistance greater than the abrasion resistance of glass lenses, having a Vicker's microindentation hardness of about 1200 kg/mm$^2$ to about 1700 kg/mm$^2$ and having optical transparency in the visible region with a minimum transmission of about 75% at 633 nm wavelength when said coating is deposited to a thickness of about 3 to about 6 micrometers.

14. The method of claim 13 wherein the gas stream fed directly into said plasma chamber also contains oxygen.

15. A method for depositing onto a parent substrate an optically transparent coating material having at least one amorphous layer consisting of silicon oxy-nitride or silicon oxy-carbonitride which comprises in sequence:

(a) chemically cleaning the exposed surface of said substrate to remove residual hydrocarbons and other contaminants;
(b) mounting said substrate in a deposition vacuum chamber and evacuating the air from said chamber;
(c) sputter-etching the surface of said substrate with a beam of ions to further remove residual hydrocarbons and other surface contaminants, and to activate the surface;
(d) plasma ion beam depositing said amorphous layer onto the surface of said substrate by exposing said substrate to silicon-containing precursors selected from the group consisting of hexamethylcyclotrisilazane, tetramethylcyclotetrasiloxane, tetramethyldisiloxane, and tetramethyldisilazane, whereby said precursor gases are activated by said plasma ion beam having a beam current density at said substrate of greater than about 1.5 mA/cm$^2$ and having a mean beam kinetic energy of about 20 to about 200 eV, and said substrate, at a temperature of about 200° C. to about 500° C., is bombarded by ions during the deposition using a gridless ion source having a plasma chamber therein, wherein a plasma is generated in the plasma chamber and wherein a gas stream containing at least a portion of said precursor gases is introduced outside of the ion source and into the plasma ion beam, and a gas stream containing nitrogen, hydrogen, oxygen is introduced directly into said plasma chamber during the deposition;
(e) increasing the vacuum chamber pressure to atmospheric pressure; and
(f) recovering a product having an abrasion resistance greater than the abrasion resistance of glass lenses, having a Vicker's microindentation hardness of about 1200 to about 1700 kg/mm$^2$ and having optical transparency in the visible region with a minimum transmission of about 75% at 633 nm wavelength when said coating is deposited to a thickness of about 3 to about 6 micrometers.

* * * * *